United States Patent
Abe et al.

(10) Patent No.: US 11,024,514 B2
(45) Date of Patent: Jun. 1, 2021

(54) ETCHING METHOD AND ETCHING APPARATUS

(71) Applicant: TOKYO ELECTRON LIMITED, Tokyo (JP)

(72) Inventors: Takuya Abe, Nirasaki (JP); Hidenori Miyoshi, Nirasaki (JP); Akitaka Shimizu, Nirasaki (JP); Koichi Nagakura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/523,541

(22) Filed: Jul. 26, 2019

(65) Prior Publication Data

US 2020/0035504 A1 Jan. 30, 2020

(30) Foreign Application Priority Data

Jul. 30, 2018 (JP) .............................. JP2018-142005
Mar. 25, 2019 (JP) .............................. JP2019-055846

(51) Int. Cl.
*H01L 21/311* (2006.01)
*H01L 21/3065* (2006.01)
*H01L 21/67* (2006.01)
*H01L 27/11582* (2017.01)

(52) U.S. Cl.
CPC .... *H01L 21/31116* (2013.01); *H01L 21/3065* (2013.01); *H01L 21/67069* (2013.01); *H01L 27/11582* (2013.01)

(58) Field of Classification Search
CPC ......... H01L 21/31116; H01L 21/67069; H01L 21/3065; H01L 27/11582; H01L 21/32137; H01L 21/6719; H01L 21/67742; H01J 37/32431; H01J 2237/3341
See application file for complete search history.

(56) References Cited

U.S. PATENT DOCUMENTS

| | | | |
|---|---|---|---|
| 2014/0134842 A1 | 5/2014 | Zhang et al. | |
| 2018/0151333 A1 | 5/2018 | Katsunuma | |
| 2019/0122865 A1* | 4/2019 | Chen ................. | H01L 21/02164 |

FOREIGN PATENT DOCUMENTS

| | | |
|---|---|---|
| JP | 2014-508424 A | 4/2014 |
| KR | 10-2010-0109893 A | 10/2010 |
| KR | 10-2015-0141135 A | 12/2015 |
| KR | 10-2018-0048689 A | 6/2018 |
| WO | 2018-026867 A1 | 2/2018 |

* cited by examiner

*Primary Examiner* — Nadine G Norton
*Assistant Examiner* — Mahmoud Dahimene
(74) *Attorney, Agent, or Firm* — Nath, Goldberg & Meyer; Jerald L. Meyer

(57) ABSTRACT

There is provided an etching method including: loading a substrate having a recess and an etching target portion existing on an inner surface of the recess into a processing container, the etching target portion being made of SiN or Si; preferentially modifying a surface of the etching target portion at a top portion of the recess by performing an oxygen-containing plasma process on the substrate inside the processing container; and subsequently, dry-etching the etching target portion in an isotropic manner.

16 Claims, 12 Drawing Sheets

ETCHING METHOD AND ETCHING APPARATUS

CROSS-REFERENCE TO RELATED APPLICATIONS

This application is based upon and claims the benefit of priority from Japanese Patent Application Nos. 2018-142005 and 2019-055846, filed on Jul. 30, 2018, and Mar. 25, 2019, respectively, the entire contents of which are incorporated herein by reference.

TECHNICAL FIELD

The present disclosure relates to an etching method and an etching apparatus.

BACKGROUND

In recent years, fine etching is performed in the process of manufacturing semiconductor devices. For example, a technology of isotropically etching SiN or Si on an inner surface of a groove or hole that has a high aspect ratio is required.

One technology of etching SiN, as disclosed in Patent Document 1, is a technology of etching SiN with fluorine radicals or fluorine ions by forming a fluorine-containing gas such as an $NF_3$ gas into a plasma. Further, the technology disclosed in Patent Document 1 etches SiN while suppressing etching of $SiO_2$ by allowing the fluorine-containing gas to contain an oxygen source such as an $O_2$ gas.

RELATED ART DOCUMENT

Patent Documents

Patent Document 1: Japanese Patent Laid-Open Publication No. 2014-508424

SUMMARY

The present disclosure provides an etching method and an etching apparatus which are capable of uniformly etching SiN or Si formed on an inner surface of a fine recess.

According to an embodiment of the present disclosure, there is provided an etching method including: loading a substrate having a recess and an etching target portion existing on an inner surface of the recess into a processing container, the etching target portion being made of SiN or Si; preferentially modifying a surface of the etching target portion at a top portion of the recess by performing an oxygen-containing plasma process on the substrate inside the processing container; and subsequently, dry-etching the etching target portion in an isotropic manner.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereafter, embodiments will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

History and Outline

First, a history and outline of an etching method according to an embodiment of the present disclosure will be described.

For example, there is a process of isotropically dry-etching SiN through a groove formed in a stack direction in an ONON stacked structure in which silicon oxide films ($SiO_2$ films) and silicon nitride films (SiN films) are stacked one above another. The ONON stacked structure exists in a 3D-NAND type nonvolatile semiconductor device.

In such an ONON stacked structure, since a thickness is as thick as 1 µm or more and the formed groove has a high aspect ratio, SiN at a top portion of the groove is preferentially etched by a loading (depth loading) effect. Accordingly, it is required that etching is performed in both the top portion and a bottom portion of the groove at the same quantity by suppressing etching of SiN at the top portion of the groove.

In some instances, SiN formed throughout the inner surface of the groove having a high aspect ratio may be etched. Even in this case, SiN at the top portion of the groove may be preferentially etched due to the loading effect.

Occasionally, Si may exist on the inner surface of the groove having a high aspect ratio. Even in a case of etching such a Si, the same problem may arise. Further, this problem is not limited to the groove but may arise even for a hole.

Accordingly, in an embodiment, a substrate that has a recess formed therein and an etching target portion existing on the inner surface of the recess, is loaded into a processing container. The etching target portion is made of SiN or Si. An oxygen-containing plasma process is performed on the substrate inside the processing container, thereby preferentially modifying a surface of the etching target portion at a top portion of the recess. Subsequently, the etching target portion is isotropically dry-etched.

Thus, in the top portion of the recess, the etching target portion is hardly etched relative to other portions. This reduces the loading effect, which makes it possible to uniformly etch the etching target portion on the inner surface of the recess.

Specific Embodiments

Next, specific embodiments will be described.

Figure 1:
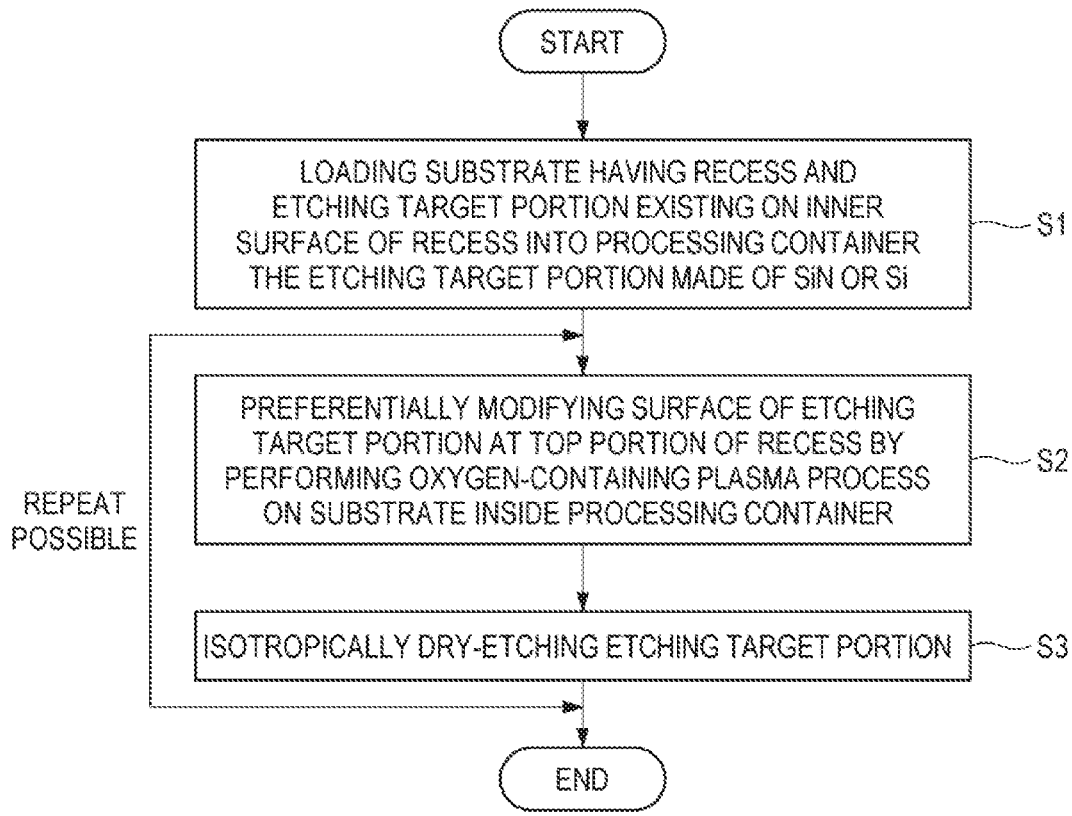
FIG. 1 is a flowchart illustrating an etching method according to a specific embodiment.

FIG. 1 is a flowchart illustrating an etching method according to a specific embodiment.

First, a substrate, which has a recess formed therein and an etching target portion existing on the inner surface of the recess, is loaded into a processing container (step S1). The etching target portion is made of SiN or Si. Subsequently, the substrate is subjected to an oxygen-containing plasma process inside the processing container so that the surface of the etching target portion at the top portion of the recess is modified (step S2). Subsequently, the etching target portion is isotropically thy-etched (step S3). Steps S2 and S3 may be repeated.

The substrate may be, but is not particularly limited to, for example, a semiconductor wafer represented by a silicon wafer. The SiN or Si constituting the etching target portion is typically a film. For example, the SiN film is formed by a thermal CVD, plasma CVD, ALD or the like using a silane-based gas as a Si precursor such as an $SiH_4$ gas, an $SiH_2Cl_2$, an $Si_2Cl_6$ or the like, and a nitrogen-containing gas such as an $NH_3$ gas, an $N_2$ gas, a hydrazine-based compound gas or the like. For example, the Si film is formed by thermal CVD using a silane-based gas as a Si precursor such as an $SiH_4$ gas, an $Si_2H_6$ gas or the like. The Si film may be doped with B, P, C, As or the like.

The recess formed in the substrate may be a groove or hole. The smaller the width of the groove or the diameter of the hole and the larger the aspect ratio of the recess, the larger the loading effect. Thus, the effects of the present embodiment can be easily achieved. The width of the groove and the diameter of the hole may be 300 nm or less, and the aspect ratio of the recess may be 25 or more.

Figure 2:
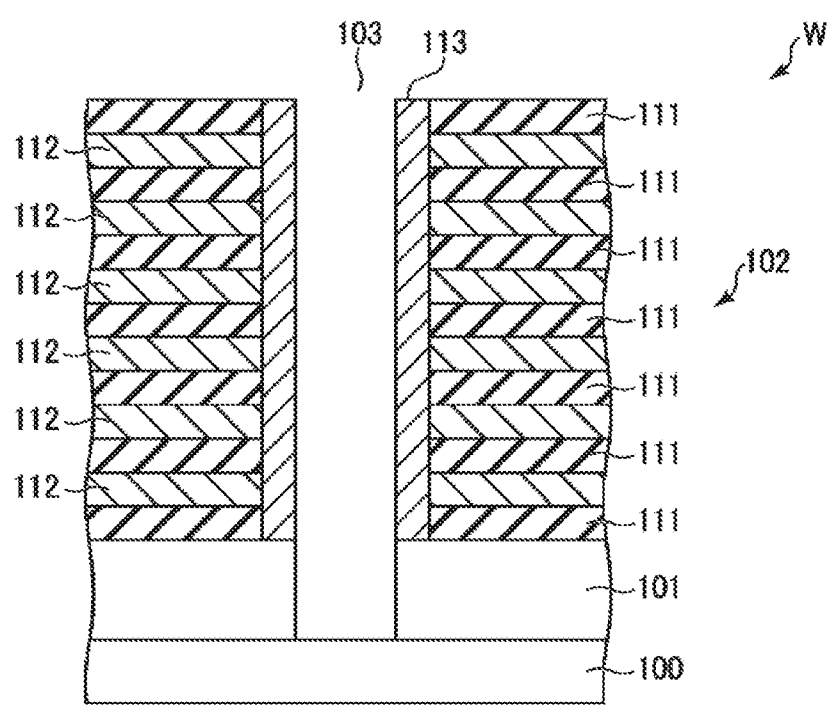
FIG. 2 is a cross-sectional view showing an example of a structure of a substrate to be etched.

FIG. 2 is a cross-sectional view showing an example of a structure of a substrate to be etched, in which a semiconductor wafer W (hereafter, simply referred to as a wafer W) having an ONON stacked structure for a 3D-NAND non-volatile semiconductor device is shown.

In the present embodiment, the wafer W has a stacked structure 102 formed on a silicon base body 100 via a lower structure 101. The stacked structure 102 is obtained by stacking $SiO_2$ films 111 and SiN films 112 one above another. The number of the $SiO_2$ films 111 and the SiN films 112 that are stacked one above another is about one hundred in practice. A groove (slit) 103 is formed to penetrate through the stacked structure 102 in the stack direction. A slit SiN film 113 is formed on the entire inner surface of the groove 103.

Figure 3:
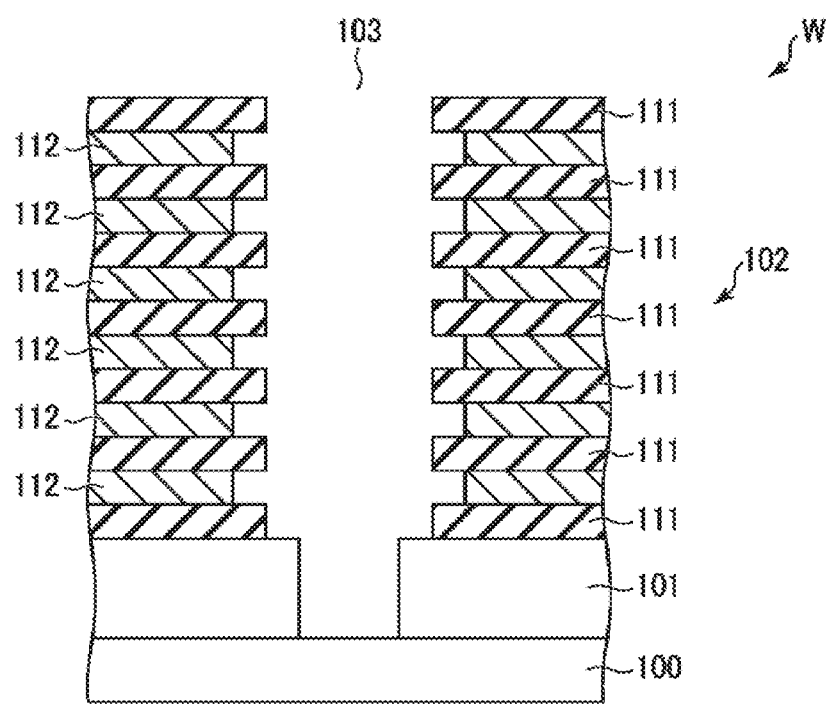
FIG. 3 is a cross-sectional view showing an ideal state when the substrate of FIG. 2 is etched.

Form this state, the entire SiN film 113 formed on the entire inner surface of the groove 103 and a portion of each SiN film 112 of the stacked structure 102 are isotropically etched in a collective manner. As a result, an ideal state shown in FIG. 3 is obtained.

Figure 4:
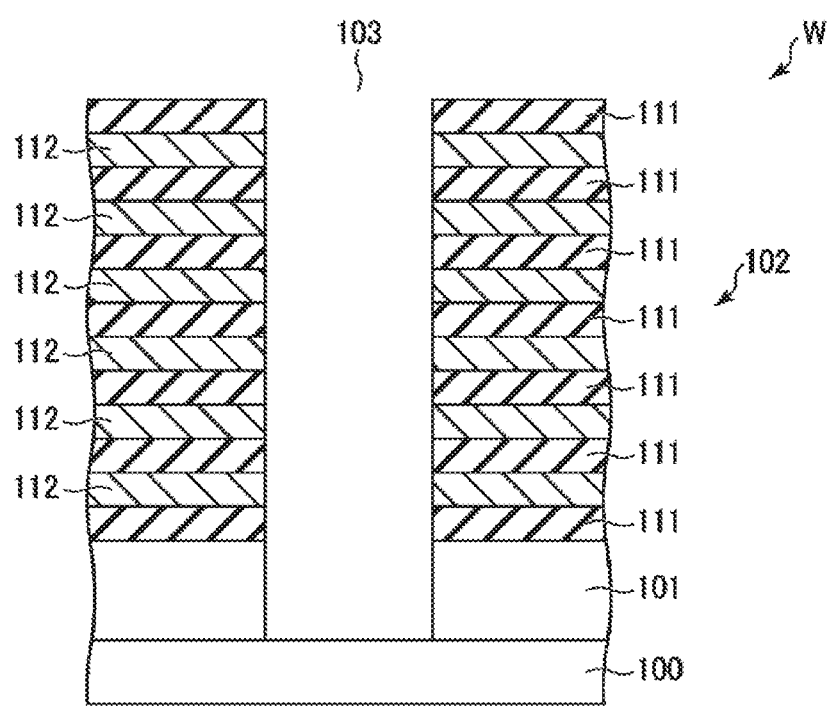
FIG. 4 is a cross-sectional view showing another example of a substrate to be etched.

FIG. 4 is a cross-sectional view showing another example of a structure of a substrate to be etched, in which a wafer having an ONON stacked structure for a 3D-NAND non-volatile semiconductor device is shown. In FIG. 4, no slit SiN film 113 is formed on the inner surface of the groove 103. That is to say, the $SiO_2$ films 111 and the SiN films 112 constituting the ONON stacked structure exist on the inner surface of the groove 103.

Figure 5:
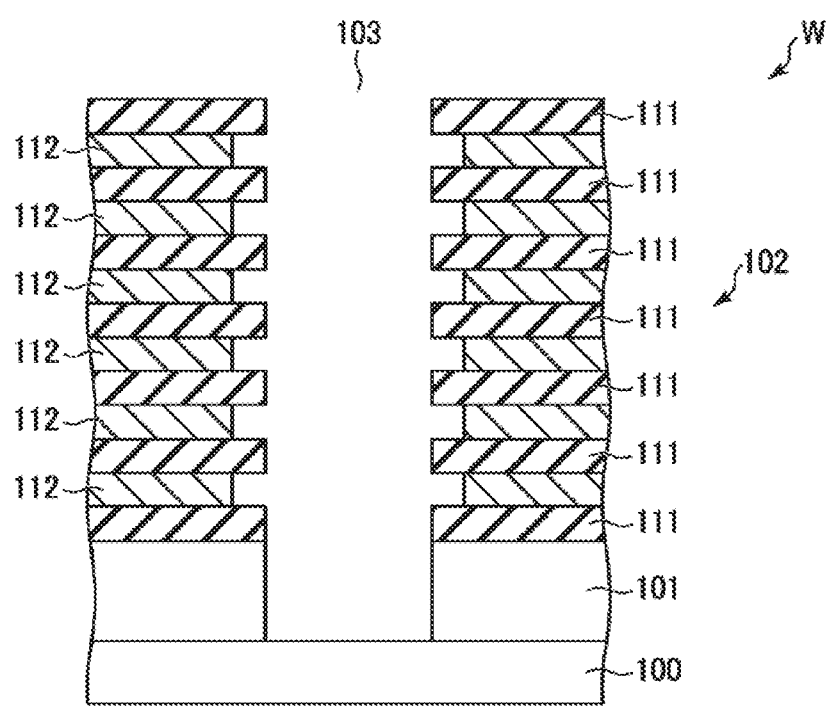
FIG. 5 is a cross-sectional view showing an ideal state when the substrate of FIG. 4 is etched.

Even in this example, from the state of FIG. 4, a portion of each SiN film 112 of the stacked structure 102 is isotropically etched. As a result, an ideal state shown in FIG. 5 is obtained.

Figure 6:
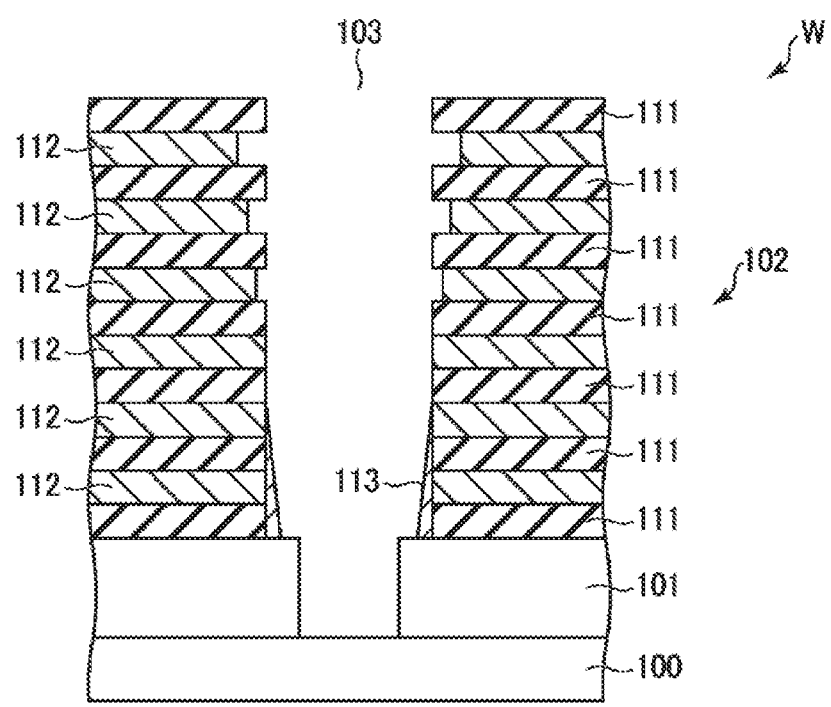
FIG. 6 is a cross-sectional view showing a state when the substrate having the structure of FIG. 2 is isotropically etched as it is.

However, in the wafer W having the structure of FIG. 2, when SiN is isotropically etched, in practice, SiN at the top portion of the groove 103 is preferentially etched due to the loading effect, as shown in FIG. 6. As a result, etching of SiN at the top portion and the bottom portion of the groove 103 becomes non-uniform. This holds true in the wafer W having the structure of FIG. 4.

Figure 7:
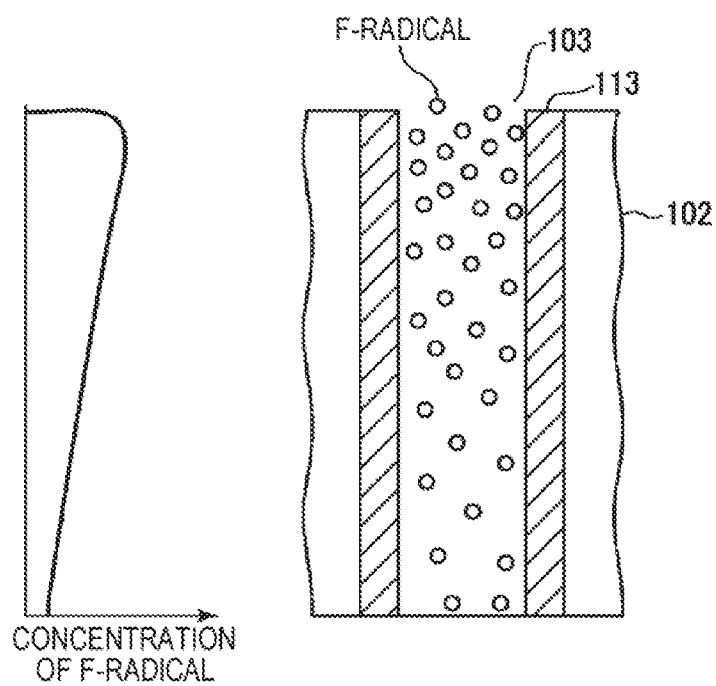
FIG. 7 is a view showing a concentration distribution of F-radicals when SiN is subjected to an isotropic dry-etching.

This is because when SiN is isotropically dry-etched, the concentration of F-radicals that are generally used as an etchant is higher at the top portion than the bottom portion of the groove 103, as shown in FIG. 7.

This phenomenon is also true in cases where the slit SiNs or stacked SiNs of the ONON stacked structure described above are etched, only SiN formed on the entire inner surface of a groove or hole is etched, or Si is etched.

Accordingly, in the present embodiment, before etching SiN or Si that is an etching target portion, an oxygen-containing plasma process is performed to modify the surface of the etching target portion.

Figure 8:
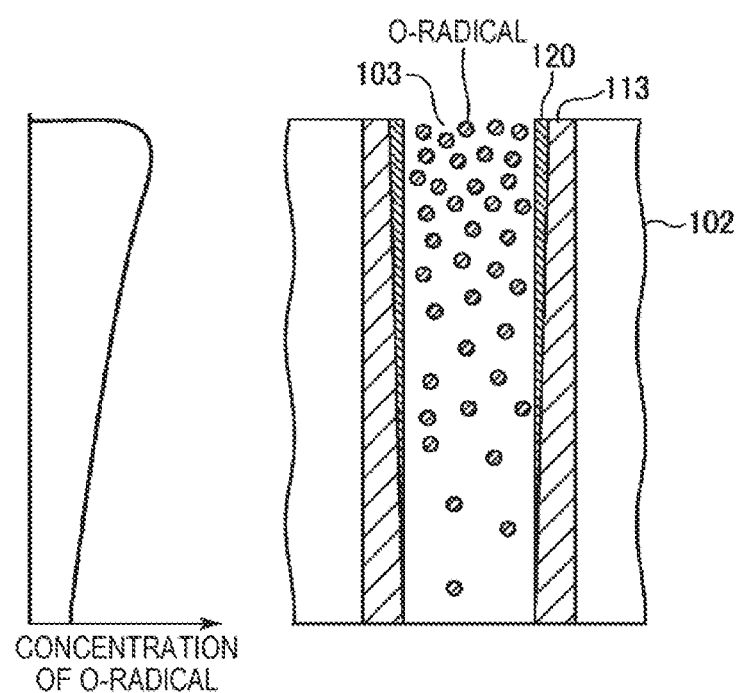
FIG. 8 is a view showing a concentration distribution of O-radicals when an oxygen-containing plasma process is performed in an embodiment.

As the oxygen-containing plasma process is performed, oxygen radicals (O-radicals) in the plasma acts on the etching target portion (SiN or Si) so that the surface of the etching target portion is oxidized to form a modified layer 120. The modified layer 120 makes etching hard to relatively occur. As shown in FIG. 8, the concentration of the O-radicals is high at the top portion and low at the bottom portion of the recess (groove) 103. Thus, the top portion of the recess is preferentially modified so that a thickness of the modified layer 120 in the surface of the etching target portion becomes thick at the top portion of the recess.

Accordingly, the oxygen-containing plasma process makes it possible to relatively suppress an etched amount of the etching target portion at the top portion of the recess. This makes it possible to suppress a difference between etched amounts at the top portion and the bottom portion of the recess, thus achieving more uniform etching.

Figure 9:
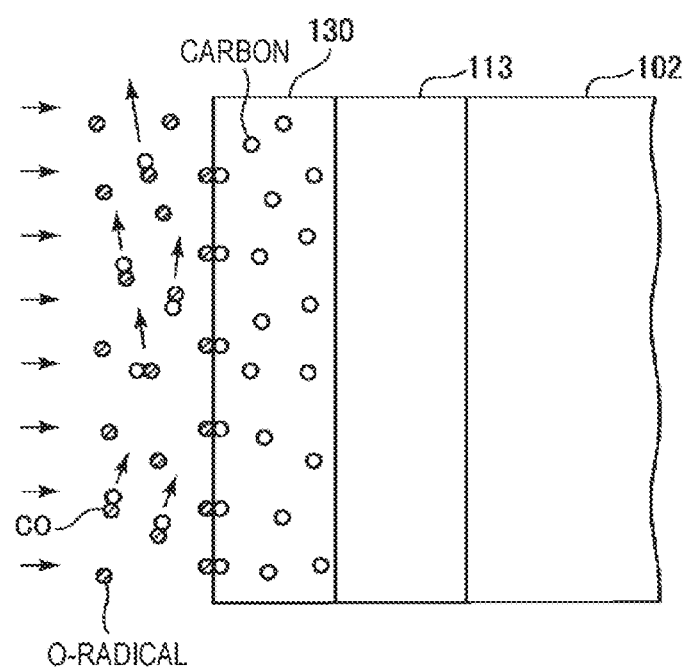
FIG. 9 is a view illustrating the operation of an oxygen-containing plasma process when a damage layer having carbon is formed on a front surface of an etching target portion.

Further, there may be a case where a damage layer containing carbons is formed on the surface of an etching target portion. Such a damage layer inhibits etching. In this case, for example, it is possible to remove carbons as COs from a damage layer 130 on the surface of the slit SiN film 113, as shown in FIG. 9, by performing the oxygen-containing plasma process. This makes it possible to increase an etched amount of the etching target portion in the entire recess.

Accordingly, in the case where the damage layer containing carbon is formed on the surface of the etching target portion, the oxygen-containing plasma process provides both an effect of relatively suppressing an etched amount of the etching target portion at the top portion of the recess and an effect of increasing the etched amount by removing carbons from the damage layer. Accordingly, by performing the dry-etching after performing the oxygen-containing plasma process on the etching target portion having the damage layer formed thereon, it is possible to increase the etched amount of the etching target portion in the entire recess and suppress a difference between the etched amount at the top portion of the recess and the etched amount at the bottom portion of the recess.

The oxygen-containing plasma process in step S2 applies oxygen-containing plasma with respect to the substrate accommodated in the processing container. The oxygen-containing plasma process performed at this time may apply mainly oxygen radicals (O-radicals) in plasma. To do this, remote plasma may be used. The remote plasma produces oxygen-containing plasma in a plasma production space that is separate from a process space where the substrate is disposed and returns the produced plasma to the process space. At this time, oxygen ions ($O_2$ ions) in the oxygen-containing plasma are easily deactivated during transfer so that the O-radicals are mainly supplied to the process space. By performing process mainly using the O-radicals, it is possible to reduce damage to the substrate. In this process, a plasma source is not particularly limited, but may be an inductively coupled plasma source or a microwave plasma source.

In some embodiments, gas used at this time may be an $O_2$ gas alone and may be gas obtained by adding at least one of an gas and a noble gas to the $O_2$ gas. The addition of the $H_2$ gas to the $O_2$ gas increases oxidization power. Further, the addition of the noble gas to the $O_2$ gas stabilizes plasma. The noble gas may be, but is not particularly limited to, an Ar gas. In some embodiments, pressure used at this time may fall within a range of 1 to 3,000 mTorr (0.13 to 400 Pa). By setting the pressure to such a range, it is possible to further increase the effect of suppressing etching at the top portion of the recess.

In step S2, a flow rate of each gas may be appropriately set depending on a device. A ratio ($H_2/O_2$) of the $H_2$ gas to the $O_2$ gas in the flow rate may be 1 or less. Plasma production power also depends on a device and may be 50 to 950 W. A period of time during which step S2 is performed may be 10 to 180 sec and a temperature of the substrate may be 5 to 85 degrees C. Specifically, the temperature of the substrate may be 15 to 85 degrees C.

The process of isotropically dry-etching the etching target portion in step S3 may include selectively etching SiN or Si with respect to other materials such as $SiO_2$. This process may use a fluorine-containing gas. The dry-etching may be a plasma-based process or a plasma-free gas etching. For example, the dry-etching may be the plasma-based process. Specifically, the dry-etching may be a remote plasma-based process mainly using fluorine radicals (F-radicals). In the remote plasma-based process, fluorine-containing plasma is produced in a plasma production space that is separate from a process space where the substrate is disposed, and the produced plasma is transferred to the process space. At this time, fluorine ions (F-ions) in the plasma are easily deactivated during the transfer. Thus, the fluorine radicals (F-radicals) are mainly supplied to the process space. By performing the process mainly using F-radicals, damage to the substrate can be reduced. A plasma source used at this time may be, but is not particularly limited to, an inductively coupled plasma source or a microwave plasma source.

In the etching process of step S3, as described above, the modified layer is formed to have a thick thickness at the top portion of the recess by the oxygen-containing plasma process. This suppresses a difference between etched amounts at the top portion and the bottom portion of the recess. Further, in a case where a damage layer containing carbons is formed on the surface of an etching target portion, it is possible to suppress the difference between the etched amount at the top portion of the recess and the etched amount at the bottom portion of the recess while increasing the etched amount of the etching target portion in the entire recess by the oxygen-containing plasma process.

Examples of the fluorine-containing gas may include an HF gas, an $NF_3$ gas and the like. Among these, the $NF_3$ gas may be preferably used. For example, the $NF_3$ gas alone may be used. Alternatively, gas obtained by adding an $O_2$ gas to the $NF_3$ gas or the like may be used. The addition of the $O_2$ gas to the $NF_3$ gas provides an effect of modifying (oxidizing) the top portion of the recess by the O-radicals even in etching. Further, a noble gas may be added to the $NF_3$ gas or the like. The addition of the noble gas to the $NF_3$ gas stabilizes plasma. The noble gas may be, but is not particularly limited to, an Ar gas. All the $NF_3$ gas or the like, the $O_2$ gas, and the noble gas may be used as the fluorine-containing gas. Pressure may fall within a range of 1 to 3,000 mTorr (0.13 to 400 Pa). By setting the pressure to such a range, it is possible to further increase the effect of suppressing a difference between etched amounts at the top portion and the bottom portion of the recess. In this case, a flow rate of each gas may be appropriately set depending on a device. In some embodiments, in the case where the $O_2$ gas is added to the $NF_3$ gas, a ratio ($NF_3/O_2$) of the $NF_3$ gas to the $O_2$ gas in the flow rate may be 0.01 or more. Further, the plasma production power may fall within a range of 50 to 950 W. A temperature of the substrate may fall within a range of 5 to 85 degrees C., specifically a range of 15 to 85 degrees C. A period of time during which step S3 is performed may be appropriately determined depending on an amount of the etching target portion to be etched.

In some embodiments, the oxygen-containing plasma process in step S2 and the isotropic dry-etching in step S3 may be performed in the same processing container. This maintains throughput of a high level. For example, the same remote plasma device may be used to perform both steps S2 and S3 through a radical-based process.

As described above, steps S2 and S3 may be repeated. Depending on an amount of an etching target portion to be etched, there may be a case where the modification effect is not sufficient through a single oxygen-containing plasma process. In this case, steps S2 and S3 may be appropriately repeated until a sufficient modification effect is obtained.

One Example of Processing System

Figure 10:
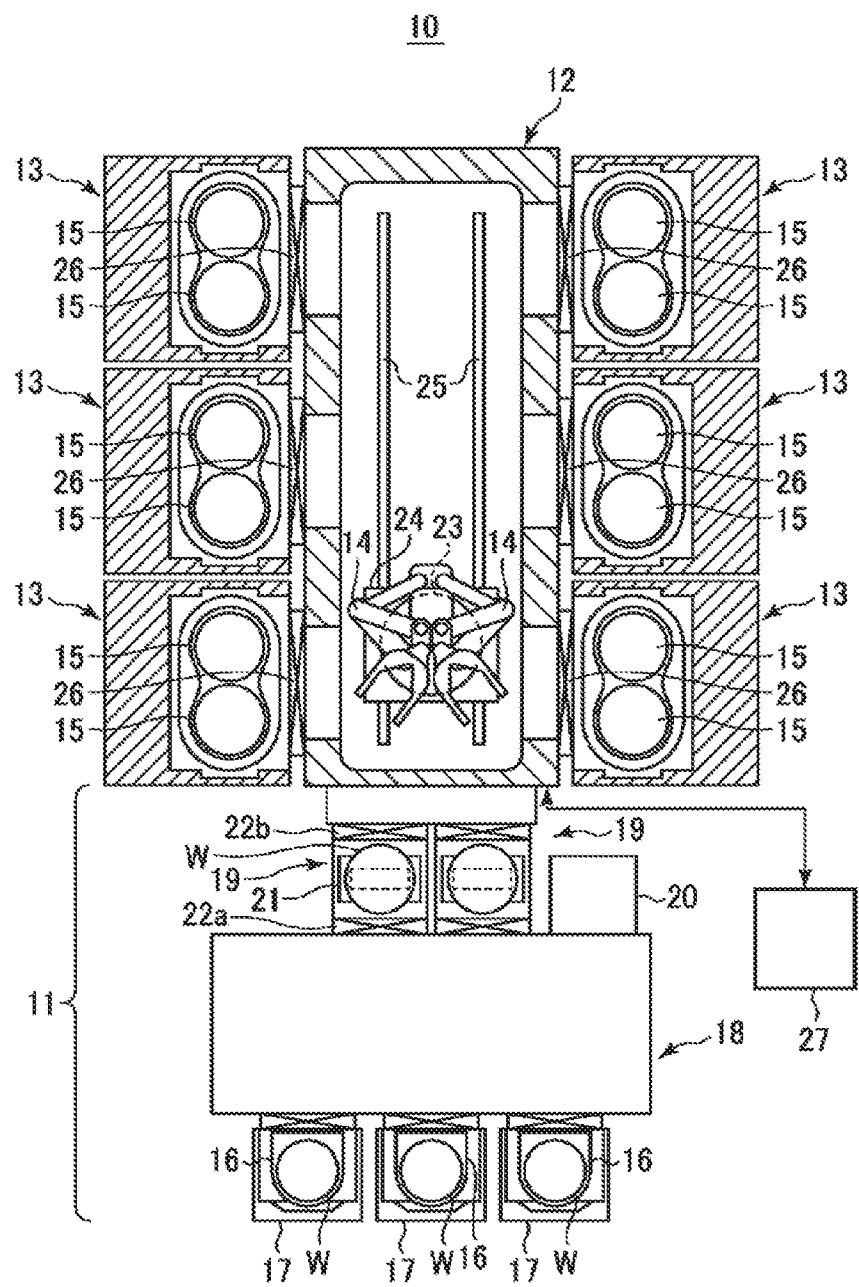
FIG. 10 is a partial cross-sectional plan view schematically showing an example of a processing system that is used for the etching method of the present embodiment.

Next, an example of a processing system that is used for the etching method of the present embodiment will be described. FIG. 10 is a partial cross-sectional plan view schematically showing an example of the processing system that is used for the etching method of the present embodiment.

As shown in FIG. 10, a processing system 10 includes a loading/unloading part 11 configured to store a plurality of wafers W and load/unload the wafers W, a transfer module 12 as a transfer chamber configured to transfer simultaneously two sheets of wafers W, and a plurality of process modules 13 each of which configured to perform a SiN film etching process or a heating process on the wafers W loaded thereto from the transfer module 12. The interiors of each of the process modules 13 and the transfer module 12 are kept in a vacuum atmosphere.

In the processing system 10, the wafers W stored in the loading/unloading part 11 are transferred by transfer arms 14 disposed in the transfer module 12, and are mounted on two stages 15 disposed in each of the process modules 13, respectively. Subsequently, in the processing system 10, the wafers W mounted on the respective stages 15 are subjected to the SiN film etching process or the heating process inside the process module 13. Thereafter, the wafers W that has subjected to the respective process are transferred to the loading/unloading part 11 by the transfer arms 14.

The loading/unloading part 11 includes a plurality of load ports 17, a loader module 18, two load lock modules 19 and a cooling storage 20. Each of the plurality of load ports 17 services a stage of a FOUP 16 as a container in which the plurality of wafers W is accommodated. The loader module 18 receives the wafer W from the FOUP 16 mounted on each of the load ports 17 or delivers processed wafers W which have subjected to a predetermined process in the process module 13, to the FOUP 16. Each of the two load lock modules 19 temporarily holds the wafer W to deliver the wafer W between the loader module 18 and the transfer module 12. The cooling storage 20 cools down the wafers W that have subjected to the heating process.

The loader module 18 is a rectangular housing whose interior is kept in an atmospheric atmosphere. The plurality of load ports 17 are arranged in a row along one of the long sides of the rectangle. Further, the loader module 18 includes a transfer arm (not shown) provided therein so as to move along the long sides of the rectangle. The transfer arm loads the wafer W from the FOUP 16 mounted on each of the load ports 17 into the load lock module 19, or unloads the wafer W from the load lock module 19 to the respective FOUP 16.

Each of the load lock modules 19 temporarily holds the waters W to deliver the wafers W accommodated in the FOUP 16 mounted on each load port 17 kept in an atmospheric atmosphere to the process modules 13 whose interior is kept in a vacuum atmosphere. Each of the load lock modules 19 includes a buffer plate 21 configured to hold two sheets of wafers W. Further, each of the load lock modules 19 includes a gate valve 22a for securing airtightness against the loader module 18 and a gate valve 22b for securing airtightness against the transfer module 12. Further, a gas introduction system and a gas exhaust system (both not shown) are coupled to each of the load lock module 19 through respective pipes such that the interior of each of the load lock modules 19 can be switched between the atmospheric atmosphere and the vacuum atmosphere.

The transfer module 12 loads non-processed wafers W from the loading/unloading part 11 to each of the process modules 13 and unloaded processed wafers W from the respective process module 13 to the loading/unloading part 11. The transfer module 12 is a rectangular housing whose interior is kept in a vacuum atmosphere. The transfer module 12 includes the two transfer arms 14 configured to hold and move two sheets of wafers W, a rotary table 23 configured to rotatably support the transfer arms 14, a rotary stage 24 on which the rotary table 23 is mounted, and guide rails 25 configured to guide the rotary stage 24 to be movable along the long sides of the transfer module 12. Further, the transfer module 12 is coupled to the load lock modules 19 of the loading/unloading part 11 through the gate valves 22b, respectively, and is coupled to the process modules 13 through gate vales 26 to be described below, respectively. In the transfer module 12, the transfer arms 14 load two sheets of wafers W from the load lock modules 19 into the respective process module 13, and unloaded two sheets of processed wafers W from the respective process module 13 into another process module 13 or the load lock modules 19.

In the processing system 10, each of the process modules 13 performs an etching process or a heating process on SiN or Si that is an etching target portion. That is to say, a predetermined number of process modules among six process modules 13 are used for the etching process and the others are used for the heating process of removing residue after the etching process. The numbers of the process modules 13 used for the etching process and the number of the process module 13 used for the heating process are appropriately determined depending on respective process times.

The processing system 10 includes a control part 27. The control art 27 includes a main controller equipped with a CPU for controlling the operation of each component of the processing system 10, an input device (a keyboard, a mouse, etc.), an output device (a printer, etc.), a display device (a display, etc.), and a memory device (a memory medium). The main controller of the control part 27 controls the processing system 10 to execute predetermined operations on the basis of, for example, a process recipe stored in the memory medium incorporated in the memory device or the memory medium set in the memory device.

Etching Apparatus

Figure 11:
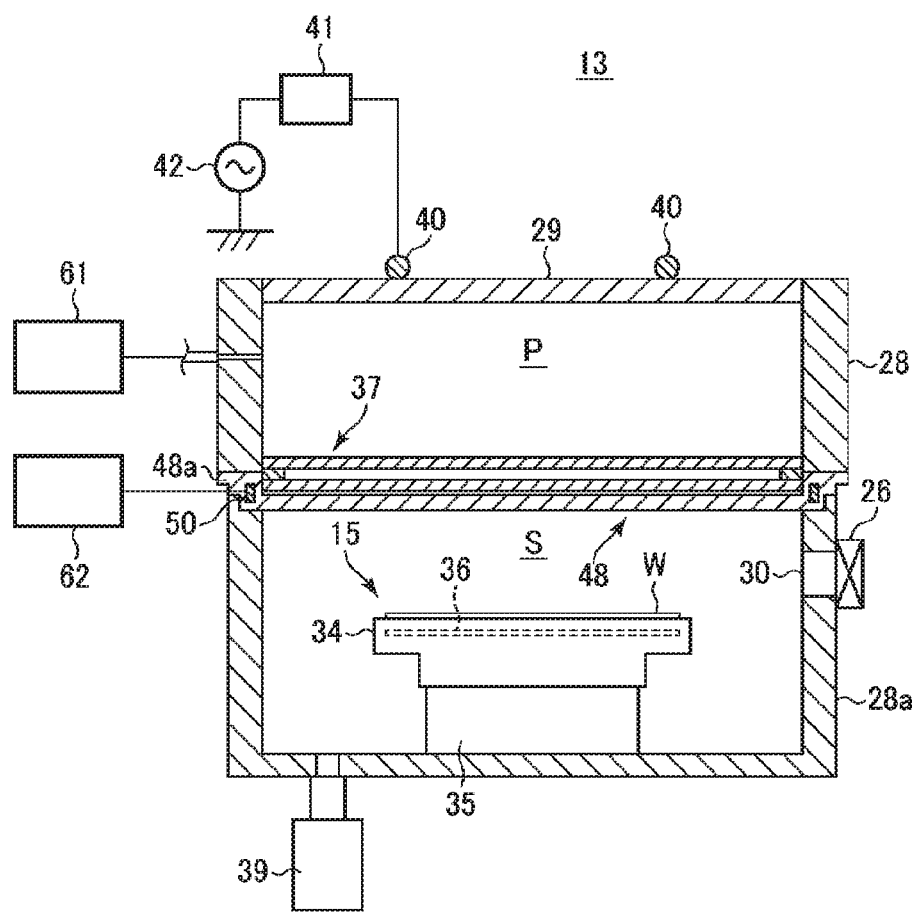
FIG. 11 is a cross-sectional view schematically showing an example of a processor module that functions as an etching apparatus for performing the etching method of the present embodiment, the processor module being mounted on the processing system of FIG. 10.

Next, an example of the process module 13 that functions as an etching apparatus for implementing the etching method of the present embodiment will be described. The process module 13 is provided in the processing system 10. FIG. 11 is a cross-sectional view schematically showing an example of the process module 13 that functions as the etching apparatus in the processing system 10 of FIG. 10.

As shown in FIG. 11, the process module 13 that functions as the etching apparatus includes an airtight processing container 28 in which the wafers W are accommodated. The processing container 28 is made of, for example, aluminum or an aluminum alloy, and is opened at the upper end. The upper end of the processing container 28 is closed by a cover 29 as a ceiling. A loading/unloading port 30 through the wafer W is transferred, is formed in a sidewall portion 28a of the processing container 28, and is opened/closed by the aforementioned gate valve 26.

Further, as described above, the two stages 15 (only one shown in FIG. 11) on each of which one sheet of wafer W is mounted in a horizontal posture, is disposed on the bottom of the processing container 28. The stage 15 has a substantially cylindrical shape, and includes a mounting plate 34 on which the wafer W is directly mounted and a base block 35 configured to support the mounting plate 34. A temperature controlling mechanism 36 configured to control a temperature of the wafer W is provided inside the mounting plate 34. The temperature controlling mechanism 36 includes, for example, a pipe (not shown) through which a temperature control medium (e.g., water or Galden) circulates. The temperature of the wafer W is controlled by heat exchange between the temperature control medium flowing through the pipe and the wafer W. Further, the stage 15 includes a plurality of lifting pins (not shown) used when loading or unloading the wafer W into or from the processing container 28. The lifting pins can be moved upward and downward on the mounting plate 34.

The interior of the processing container 28 is divided into a plasma production space P defined at the upper portion and a process space S defined at the lower portion by a separation plate 37. The separation plate 37 functions as a so-called ion trap that suppresses ions in plasma from transmitting from the plasma production space P into the process space S when inductively coupled plasma is produced in the plasma production space P. The plasma production space P is a space where plasma is produced. The process space S is a space where the wafers W are etched by a radical process. A first gas supplying pat 61 and a second gas supplying part 62 are disposed outside the processing container 28. The first gas supplying pat 61 supplies a process gas to be used in the etching, into the plasma production space P. The second gas supplying part 62 supplies a non-plasma gas such as a pressure regulation gas, a purge gas, a dilution gas or the like, for example, an inert gas such as an $N_2$ gas or an Ar gas, into the process space S. Further, an exhaust mechanism 39 is connected to the bottom portion of the processing container 28. The exhaust mechanism 39 includes a vacuum pump to exhaust the interior of the process space S.

A heat shield plate 48 is disposed under the separation plate 37 so as to face the wafers W. Heat is accumulated in the separation plate 37 due to repetitive production of plasma in the plasma production space P. The heat shield plate 48 is provided to suppress radical distribution in the process space S from influencing by the heat. The heat shield plate 48 is formed larger than the separation plate 37. A flange 48a constituting a peripheral portion of the heat shield plate 48 is embedded in the sidewall portion 28a of the processing container 28. Further, a cooling mechanism 50, for example, a coolant channel, a Chiller, or a Peltier element is embedded in the flange 48a.

The first gas supplying pat 61 supplies an $O_2$ gas, an $H_2$ gas, an $NF_3$ gas, and a noble gas (for example, an Ar gas) into the plasma production space P. These gases are plasmarized in the plasma production space P. Further, the noble gas functions as a plasma production gas, and also function as the pressure regulation gas, the purge gas or the like.

Further, the process module 13 is configured as an inductively coupled plasma etching apparatus that uses an RF antenna. The cover 29 constituting the ceiling of the processing container 28 is formed as, for example, a circular quartz plate, and functions as a dielectric window. A ring-shaped RF antenna 40 for producing inductively coupled plasma in the plasma production space P of the processing container 28 is provided on the cover 29. The RF antenna 40 is coupled to a high-frequency power supply 42 through a matching box 41. The high-frequency power supply 42 outputs a high-frequency power of a predetermined frequency (e.g., 13.56 MHz, or more) suitable for producing plasma through high-frequency discharge of inductive coupling, which corresponds to a predetermined output value. The matching box 41 includes a reactance-variable matching circuit (not shown) for taking an impedance matching between the high-frequency power supply 42 and a load (the RF antenna 40 or plasma).

Among the process modules 13, details of one functioning as a heating apparatus that performs the heating process is omitted but includes two stages 15 disposed in the processing container, similar to the etching apparatus shown in FIG. 11. However, unlike the etching apparatus, the process module functioning as the heating apparatus does not include a plasma production mechanism, and is configured to heat the wafers W mounted on the stages at predetermined temperature using heaters provided inside the stages 15 while supplying an inert gas into the processing container. Further, the process module removes etching residues or reaction products existing on the wafers W by heating the wafers W after etching.

In performing the etching method according to the above embodiment by the processing system 10, first, the wafer W having the structure shown in FIG. 2 is taken out from the FOUP 16 by the transfer arms of the loader module 18 and is loaded into the load lock module 19. The load lock module 19 is evacuated. Subsequently, the wafers W inside the load lock module 19 are loaded into the process module 13 that functions as the etching apparatus by the transfer arms 14 of the transfer module 12 (in step S1).

Subsequently, the $N_2$ gas is introduced as a pressure regulation gas into the processing container 28 from the second gas supplying part 62. An internal pressure of the processing container 28 is set to, for example, 1,000 to 4,000 mTorr (133 to 533 Pa). A temperature of each wafer W is stabilized at predetermined temperature by holding the waters W for a predetermined period of time, for example, 30 sec, on the stages 15 of which the temperature is adjusted at 5 to 85 degrees C. by the temperature controlling mechanism 36.

Subsequently, the interior of the processing container 28 is purged, the internal pressure of the processing container 28 may be set to 1 to 3,000 mTorr (0.13 to 400 Pa), for example, 500 mTorr (66.5 Pa), and the oxygen-containing plasma process of step S2 is performed. In the oxygen-containing plasma process, the $O_2$ gas is supplied from the first gas supplying part 61 into the plasma production space P and a high-frequency power is applied to the RF antenna 40 so that plasma of $O_2$ that is inductively coupled plasma is produced. In this process, in addition to the $O_2$ gas, at least one of an $H_2$ gas and a noble gas such as an Ar gas may be supplied into the plasma production space P.

The plasma of $O_2$ produced in the plasma production space P is transferred into the process space S. At this time, ions of $O_2$ are deactivated by the separation plate 37 and O-radicals in the plasma of $O_2$ are mainly selectively introduced into the process space S. The etching target portion of the wafer W is modified (oxidized) by the O-radicals. In this case, since the concentration of the O-radicals is high at the top portion rather than another portion of the recess, the surface of the etching target portion at the top portion of the recess is preferentially modified. Thus, a thickness of the modified layer that is relatively hard to etch becomes larger at the top portion of the recess. This makes it possible to relatively suppress an amount of the etching target portion to be etched at the top portion of the recess in a subsequent etching, compared with other portions. Therefore, it is possible to suppress a difference between the etched amount at the top portion of the recess and the etched amount at the bottom portion of the recess, thus achieving more uniform etching. Further, the process mainly uses the O-radicals, thus reducing damage of ions to the wafer W.

Further, in the case where a damage layer containing carbon is formed on the surface of the etching target portion, it is possible to remove carbons as COs from the damage layer on the surface of the etching target portion by performing the oxygen-containing plasma process. Accordingly, it is possible to increase an amount of the etching target portion to be etched in the entire recess in a subsequent etching.

By a synergistic effect of the above effect and the effect of increasing the effect of relatively suppressing an amount of the etching target portion to be etched at the top portion of the recess by the formation of the modified layer, it is possible to suppress a difference between etched amounts of the etching target portion at the top portion and the bottom portion of the recess while increasing an amount of the etching target portion to be etched at the entire recess after etching.

The flow rate of the $O_2$ gas may fall within a range of 1 to 1,000 sccm, the flow rate of the $H_2$ gas may fall within a range of 1 to 500 sccm, and the flow rate of the noble gas (the Ar gas) may fall within a range of 1 to 1,500 sccm. Further, the plasma production power may fall within a range of 50 to 950 W. The process time may fall within a range of 10 to 180 sec.

After the oxygen-containing plasma process as described above, the interior of the processing container 28 is purged and the etching gas is discharged from the process space S.

Subsequently, the isotropic dry-etching of step S3 is performed in a state where the internal pressure of the processing container 28 is set to 1 to 3,000 mTorr (0.13 to 400 Pa), for example, 225 mTorr (30 Pa). In the isotropic dry-etching, the $NF_3$ gas as a fluorine-containing gas is supplied from the first gas supplying part 61 into the plasma production space P and the high-frequency power is applied to the RF antenna 40, thus producing a fluorine-containing plasma as an inductively coupled plasma. In this process, in addition to $NF_3$ gas, at least one of an $O_2$ gas and a noble gas such as an Ar gas may be supplied into the plasma production space P.

The fluorine-containing plasma produced in the plasma production space P is transferred into the process space S. At this time, F-ions are deactivated by the separation plate 37 and F-radicals in the plasma are mainly selectively introduced into the process space S. An SiN film or an Si film that is an etching target portion is isotropically etched by the F-radicals. In this case, as described above, since a modified layer having a relatively thick thickness is formed on the etching target portion at the top portion of the recess where the concentration of the O-radicals is higher than that of another portion of the recess by the oxygen-plasma process, a difference in etched amount between the top portion of the recess and the bottom portion of the recess is suppressed. Further, in the case where a damage layer containing carbons is formed on the surface of the etching target portion, it is possible to suppress a difference between etched amounts of the etching target portion at the top portion and the bottom portion of the recess while increasing an amount of the etching target portion to be etched in the entire recess through the oxygen-containing plasma process.

In addition, by further adding the $O_2$ gas to the $NF_3$ gas in etching, it is possible to achieve an effect of modifying (oxidizing) the top portion of the recess by the O-radicals even in etching. In order to obtain such an effect, a ratio ($NF_3/O_2$) of the $NF_3$ gas to the $O_2$ gas in flow rate may be 0.01 or more. Further, the flow rate of the $NF_3$ gas may fall within a range of 1 to 1,000 sccm, the flow rate of the $O_2$ gas may fall within a range of 1 to 1,000 sccm, and the flow rate of the noble gas (the Ar gas) may fall within a range of 1 to 1,500 sccm. Further, the plasma production power may fall within a range of 50 to 950 W. The process time may be appropriately set depending on an amount to be etched.

There may be a case where the modification effect is insufficient through a single round of oxygen-containing plasma process, depending on an amount of the etching target portion to be etched. In this case, step S2 and step S3 may be repeated a predetermined number of times.

After the etching is completed, the interior of the processing container 28 is purged, and the processed wafers W is unloaded from the processing container 28 by the transfer arms 14 of the transfer module 12. In a case where the heating process is required to remove residues after etching, the wafers W, which have been subjected to the etching process, are transferred to the process module 13 that functions as a heating apparatus by the transfer arms 14. In the heating apparatus, the wafers W are heated. After the etching process or the heating process is completed, the wafers W are transferred to the load lock modules 19 by the transfer arms 14. The interior of each of the load lock modules 19 is kept in an atmospheric atmosphere. Thereafter, the wafers W in the load lock modules 19 are returned to the FOUP 16 by the transfer arms of the loader module 18.

By the processing system 10 configured as above, it is possible to sequentially perform the oxygen-containing plasma process and the isotropic dry-etching process on the etching target portion in the same processing container, thus performing the processes with high throughput.

Experimental Examples

Next, experimental examples will be described

Experimental Example 11

In this example, through the following cases A to C, etching was performed on the slit SiN film and the stacked SiN films in the wafer having the structure of FIG. 2, using the process module 13 that functions as an etching apparatus of the processing system 10 shown in FIGS. 10 to 11.

For case A, only the isotropic etching process was performed using the $NF_3$ gas, the Ar gas, and the $O_2$ gas without performing the oxygen-containing plasma process. Conditions used herein are as follows.
Pressure: 150 to 300 mTorr (20 to 40 Pa)
Flow rate of Gas: $NF_3$=1 to 100 sccm
　　$O_2$: 1 to 400 sccm
　　Ar=1 to 200 sccm
Temperature of stage (mounting plate): 5 to 60 degrees C.
Period of time: 480 sec
High-frequency power: 400 to 800 W For case B, the oxygen-containing plasma process was performed using the $O_2$ gas, the $H_2$ gas, and the Ar gas, and subsequently, the isotropic etching process was performed using the $NF_3$ gas, the Ar gas, and the $O_2$ gas. Conditions used herein are as follows.
　　<Oxygen-Containing Plasma Process>
Pressure: 400 to 600 mTorr (53.2 to 79.8 Pa)
Flow rate of gas: $O_2$=200 to 400 sccm
　　$H_2$=1 to 100 sccm
　　Ar=1 to 100 sccm
Temperature of stage (mounting plate: 5 to 60 degrees C.
Period of time: 60 sec
High-frequency power: 400 to 300
　　<Etching Process>
Contions are the same as the case A For case C, similar to case B, the oxygen-containing plasma process was performed and subsequently the isotropic etching process was performed. The flow rate of the $O_2$ gas in the oxygen-containing plasma process was increased than that in case B and the total flow rate of the gas in the isotropic etching process was increased than that in case B. Conditions used herein are as follows.
　　<Oxygen-Containing Plasma Process>
Pressure: 400 to 600 mTorr (53.2 to 79.8 Pa)
Flow rate of gas: $O_2$=500 to 700 sccm
　　$H_2$=1 to 100 sccm
　　Ar=1 to 100 sccm
Temperature of stage (mounting plate): 5 to 60 degrees C.
Period of time: 60 sec High-frequency power: 400 to 800 W
<Etching Process>
Pressure: 150 to 300 mTorr (2.0 to 40 Pa)
Flow rate of gas: $NF_3$=1 to 100 sccm
   $O_2$: 100 to 400 sccm
   Ar=50 to 250 sccm
Temperature of stage (mounting plate: 5 to 60 degrees C.
Period of time: 480 sec
High-frequency power: 400 to 800 W An etched amount of the stacked SiN films and a difference ΔEA between etched amounts at the top and the bottom of the groove were obtained at four points (top, middle 1, middle 2, and bottom) in the depth direction of the groove (slit) after etching in cases A to C. The results are as follows.
<For Case A>
Top: 21.8 nm
Middle 1: 19.8 nm
Middle 2: 17.2 nm:
Bottom: 11.2 nm
ΔEA: 10.6 nm
<For Case B>
Top: 25.1 nm
Middle 1: 25.1 nm
Middle 2: 21.2 nm
Bottom: 21.2 nm
ΔEA: 3.9 nm
<For Case C>
Top: 20.5 nm
Middle 1: 20.5 nm
Middle 2: 20.6 nm
Bottom: 19.8 nm
ΔEA: 0.7 nm From the above results, comparing case A in which then oxygen-containing plasma process was not performed and case B in which the oxygen-containing plasma process was performed, it was found that it is possible to reduce a difference between the etched amounts at the top portion of the groove and the bottom portion of the groove by performing the oxygen-containing plasma process. Further, comparing case B and case B in both of which the oxygen-containing plasma process was performed, it was found that it was possible to reduce a difference between the etched amounts at the top portion of the groove and the bottom portion of the groove in case C in which a large amount of $O_2$ gas was used in the etching process.

Further, as a result of etching the stacked SiN films in the wafer having the structure of FIG. 4 through cases A to C, the same results were obtained.

Experimental Example 2

In this example, etching of the slit SiN film and the stacked. SiN films were performed in both the case where the oxygen-containing plasma process was performed and subsequently the etching process was performed, and the case where the etching process was performed without performing the oxygen-containing plasma process, with respect to the wafer having the damage layer formed on the surface of the slit SiN film. Specifically, the process module 13 of the processing system 10 was used as an apparatus and the water having the damage layer formed on the surface of the slit SiN film and having the structure of FIG. 2 was used as a wafer. In these cases, etched amounts of the stacked SiN films at three points (top, middle, and bottom) in the depth direction of the groove (slit) and a difference ΔEA between the etched amounts at the top and the bottom were obtained.

Further, the conditions for the oxygen-containing plasma process were the same as those in case B of the experimental example 1, and the conditions for the etching process were the same as those in case A of the experimental example 1 except that the period of time was 441 sec.

Figure 12:
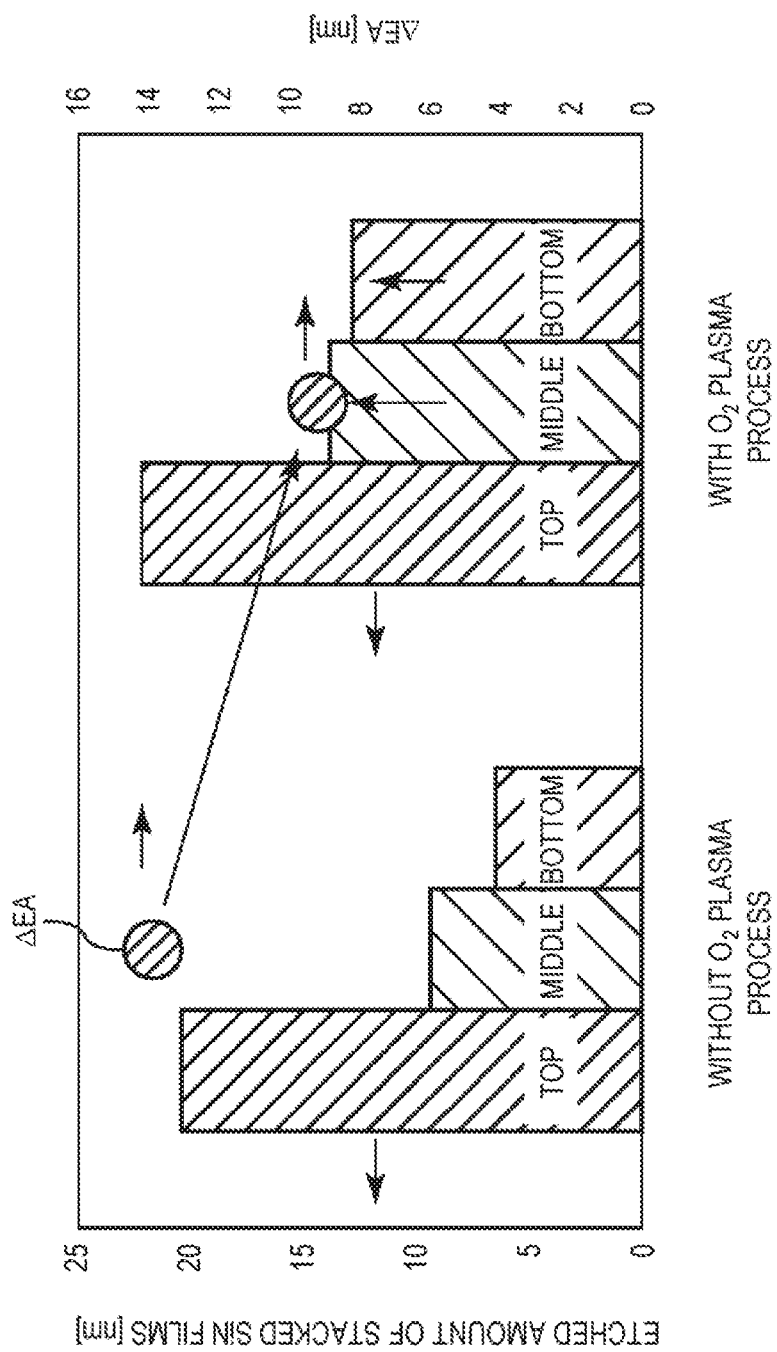
FIG. 12 is a view illustrating the effect of an experimental example 2.

The results are shown in FIG. 12, As shown in FIG. 12, in the case where the damage layer is formed on the surface of the slit SiN films, it was found that the entire etched amount can be increased and the difference ΔEA between the etched amounts at the top and the bottom can be decreased by the effect of removing carbons as COs from the damage layer on the surface of the etching target portion and the effect of relatively increasing the degree of modification at the top portion of the groove by the oxygen-containing plasma process.

Other Applications

It should be noted that the above embodiments are exemplary in all respects and are not restrictive. The above-described embodiments may be omitted, replaced or modified in various forms without departing from the scope and spirit of the appended claims.

For example, while the case where the slit SiN film and a portion of the stacked SiN films are etched, and the case where there is no slit SiN films and the stacked SiN films are etched, have been described in the above embodiments. However, the present disclosure is not limited thereto but may be applied for SiN or Si existing on an inner surface of a recess formed in any structure.

Further, the apparatuses in the above embodiments are merely examples and apparatuses having various configurations may be used. Further, although the semiconductor wafer have been described to be used as a target substrate, the present disclosure is not limited thereto. For example, other substrates such as a FPD (flat panel display) substrate, a ceramics substrate or the like, which is represented by a substrate for LCD (liquid crystal display), may be used.

According to the present disclosure, it is possible to uniformly etch SiN or Si formed on an inner surface of a recess.

What is claimed is:
1. An etching method comprising:
loading a substrate having a recess and an etching target portion existing on an inner surface of the recess into a processing container, the etching target portion being made of SiN or Si, and a carbon-containing damage layer being formed on a surface of the etching target portion;
performing an oxygen-containing plasma process on the substrate inside the processing container to preferentially modify the surface of the etching target portion at a top portion of the recess such that a thickness of the modified layer is thicker at the top portion of the recess than at a remaining portion of the recess, and to remove carbon from the carbon-containing damage layer; and
subsequently, dry-etching the etching target portion in an isotropic manner.
2. The etching method of claim 1, wherein the recess is a groove or a hole.
3. The etching method of claim 2, wherein the recess has a diameter or a width of 300 nm or less and an aspect ratio of 25 or more.
4. The etching method of claim 1, wherein the substrate has a stacked structure of an $SiO_2$ and an SiN, the recess is formed in the stacked structure, the $SiO_2$ and the SiN of the stacked structure exist on the inner surface of the recess, and a portion of the SiN of the stacked structure is the etching target portion.

5. The etching method of claim 1, wherein the substrate has a stacked structure of an $SiO_2$ and a first SiN, the stacked structure has a second SiN on the inner surface of the recess, the etching target portion is all of the second SiN and a portion of the first SiN of the stacked structure, and wherein the dry-etching includes etching the second SiN and the portion of the first SiN of the stacked structure.

6. The etching method of claim 1, wherein the oxygen-containing plasma process is performed using an $O_2$ gas alone, or at least one of the $O_2$ gas, an $H_2$ gas and a noble gas.

7. The etching method of claim 1, wherein the oxygen-containing plasma process is performed by a remote plasma, and is performed with respect to the substrate mainly using oxygen radicals in an oxygen-containing plasma.

8. The etching method of claim 1, wherein the oxygen-containing plasma process is performed at a pressure ranging from 0.13 to 400 Pa.

9. The etching method of claim 1, wherein the dry-etching is performed by a fluorine-containing gas.

10. The etching method of claim 9, wherein the fluorine-containing gas includes an $NF_3$ gas.

11. The etching method of claim 9, wherein the dry-etching is performed by the fluorine-containing gas and an $O_2$ gas.

12. The etching method of claim 11, wherein the dry-etching is performed in a state where a ratio of a flow rate of the fluorine-containing gas to a flow rate of the $O_2$ gas is 0.01 or more and 1.0 or less.

13. The etching method of claim 1, wherein the dry-etching is performed by a plasma process mainly using radicals.

14. The etching method of claim 1, wherein the dry-etching is performed at a pressure ranging from 0.13 to 400 Pa.

15. The etching method of claim 1, wherein the oxygen-containing plasma process and the dry-etching are performed in the same processing container.

16. The etching method of claim 1, wherein the oxygen-containing plasma process and the dry-etching are repeated a multiple number of times.

* * * * *